United States Patent
Li

(10) Patent No.: US 10,811,635 B2
(45) Date of Patent: Oct. 20, 2020

(54) OLED DISPLAY PANEL AND OLED DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventor: Yanqiu Li, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 16/329,678

(22) PCT Filed: Jun. 22, 2018

(86) PCT No.: PCT/CN2018/092461
§ 371 (c)(1),
(2) Date: Feb. 28, 2019

(87) PCT Pub. No.: WO2018/233698
PCT Pub. Date: Dec. 27, 2018

(65) Prior Publication Data
US 2019/0198815 A1    Jun. 27, 2019

(30) Foreign Application Priority Data
Jun. 23, 2017 (CN) .......................... 2017 1 0488300

(51) Int. Cl.
*H01L 51/52* (2006.01)
*H01L 27/32* (2006.01)
(Continued)

(52) U.S. Cl.
CPC ........ *H01L 51/5259* (2013.01); *B01J 20/267* (2013.01); *G06F 3/0412* (2013.01);
(Continued)

(58) Field of Classification Search
CPC ......... H01L 51/00; H01L 51/50; H01L 51/56; H01L 51/52; H01L 51/5259;
(Continued)

(56) References Cited

U.S. PATENT DOCUMENTS

| 8,829,527 | B2 * | 9/2014 | Yamazaki | ........... H01L 27/1214 257/72 |
| 2017/0069872 | A1 * | 3/2017 | Murakami | .......... H01L 51/5237 |
| 2017/0104080 | A1 * | 4/2017 | Lu | ........................ H01L 51/0034 |

FOREIGN PATENT DOCUMENTS

| CN | 101311888 A | 11/2008 |
| CN | 101382484 A | 3/2009 |

(Continued)

OTHER PUBLICATIONS

First Office Action for CN Appl. No. 201710488300.2, dated Jul. 26, 2018.
(Continued)

*Primary Examiner* — Chuong A Luu
(74) *Attorney, Agent, or Firm* — The Webb Law Firm

(57) ABSTRACT

This disclosure provides an OLED display panel, an OLED display device, and a method of manufacturing an OLED display panel. The OLED display panel comprises a substrate, OLED devices formed on the substrate, a touch layer, and a conductive isolation layer, the touch layer located on the side of the OLED devices facing away from the substrate, and the isolation layer located on the side of the touch layer facing away from the OLED devices. The surface of the touch layer facing away from the OLED devices conducts an electrical signal after absorbing water vapor. When a finger touches the isolation layer on the upper surface of the OLED display panel, the electrical signal on the surface of the touch layer facing away from the OLED devices can
(Continued)

be conducted from the finger through the isolation layer, so that the touch position can be determined.

17 Claims, 5 Drawing Sheets

(51) Int. Cl.
*B01J 20/26* (2006.01)
*G06F 3/041* (2006.01)
*H01L 51/56* (2006.01)
*G06F 3/044* (2006.01)
*H01L 51/50* (2006.01)

(52) U.S. Cl.
CPC .......... *G06F 3/0416* (2013.01); *G06F 3/0444* (2019.05); *H01L 27/323* (2013.01); *H01L 27/3244* (2013.01); *H01L 51/5012* (2013.01); *H01L 51/5237* (2013.01); *H01L 51/5253* (2013.01); *H01L 51/56* (2013.01); *G06F 2203/04103* (2013.01); *H01L 2227/323* (2013.01)

(58) Field of Classification Search
CPC ............. H01L 51/5012; H01L 51/5237; H01L 51/5253; H01L 51/5287; H01L 27/32; H01L 27/323; H01L 27/3244; H01L 27/3225; H01L 2227/32; H01L 2227/323; H01L 2251/56; H01L 2251/566; G06F 3/0416; G06F 3/0444; G06F 3/0412; G06F 2203/04103
USPC .......................................................... 257/40
See application file for complete search history.

(56) References Cited

FOREIGN PATENT DOCUMENTS

| | | |
|---|---|---|
| CN | 106158913 A | 11/2016 |
| CN | 106648270 A | 5/2017 |
| CN | 106783909 A | 5/2017 |
| CN | 107316945 A | 11/2017 |

OTHER PUBLICATIONS

International Search Report and Written Opinion for International Appl. No. PCT/CN2018/092461, dated Sep. 26, 2018.
Second Office Action for CN Appl. No. 201710488300.2, dated Jan. 7, 2019.

* cited by examiner

OLED DISPLAY PANEL AND OLED DISPLAY DEVICE

CROSS-REFERENCE TO RELATED APPLICATIONS

This application is a U.S. National Stage under 35 U.S.C. § 371 of International Application No. PCT/CN2018/092461, filed on Jun. 22, 2018, which claims priority to Chinese Patent Application No. 201710488300.2, filed on Jun. 23, 2017. The disclosures of each of these applications are hereby incorporated herein by reference in their entirety into this application.

TECHNICAL FIELD

This disclosure relates to an OLED display panel and an OLED display device

BACKGROUND

The Organic Light-Emitting Diode (OLED) display panel has gradually received extensive attention due to its incorporated advantages of high color gamut, thin thickness and flexibility. Especially, the curved OLED display panel and the flexible OLED display panel have been favored by many users due to the unique performance and excellent user experience. Since the OLED display panel is very sensitive to water vapor and oxygen, in order to improve the service life of the OLED display panel, an encapsulation layer is provided outside the OLED device to isolate the OLED device from water vapor.

SUMMARY

This disclosure provides an OLED display panel, comprising a substrate, OLED devices formed on the substrate, a water absorption layer, and an isolation layer, wherein the water absorption layer is located on a side of the OLED devices facing away from the substrate, and a material of the water absorption layer is able to absorb water vapor and change from an insulator to a conductor after absorbing the water vapor; and the isolation layer is located on a side of the water absorption layer facing away from the OLED devices, for blocking water vapor from entering the water absorption layer and the OLED devices.

In one or more embodiments of this disclosure, a surface of the water absorption layer facing away from the OLED devices changes from the insulator to the conductor after absorbing the water vapor such that the water absorption layer functions as a touch layer for touch operations of the display panel, and the isolation layer is further configured to conduct an electrical signal on the surface of the water absorption layer facing away from the OLED devices during touch.

In one or more embodiments of this disclosure, the surface of the water absorption layer facing away from the OLED devices forms a hydrogel layer after absorbing water vapor, wherein the hydrogel layer includes ions generated by ionization.

In one or more embodiments of this disclosure, the material of the water absorption layer is a hydrophilic material, and the material of the water absorption layer is doped with a material that is completely ionizable.

In one or more embodiments of this disclosure, the material of the water absorption layer is polyacrylamide doped with a lithium chloride salt.

In one or more embodiments of this disclosure, the material of the isolation layer is a hydrophobic material doped with charged particles.

In one or more embodiments of this disclosure, the material of the isolation layer is polyethylene terephthalate doped with polyaniline.

In one or more embodiments of this disclosure, the OLED display panel further comprises a control module, a detection module and a touch electrode, wherein the touch electrode is connected to the water absorption layer, for inputting an electrical signal to the water absorption layer; the detection module is connected to the touch electrode, for detecting the electrical signal of the touch electrode; and the control module is connected to the detection module, for determining a touch position according to a change in the electrical signal of the touch electrode.

In one or more embodiments of this disclosure, the touch electrode includes a plurality of electrodes, which are evenly distributed around a periphery of the water absorption layer; the detection module is specifically configured to respectively detect electrical signals of the electrodes; and the control module is specifically configured to determine a touch position according to a change in the electrical signals of the electrodes.

In one or more embodiments of this disclosure, the water absorption layer is rectangular in a plan view; the electrodes include a third electrode, a fourth electrode, a fifth electrode, and a sixth electrode, which are respectively connected to four corners of the water absorption layer.

This disclosure further provides an OLED display device, comprising the above-described OLED display panel.

The disclosure further provides a method of manufacturing an OLED display panel, comprising the steps of: forming OLED devices on the substrate, forming a water absorption layer on the side of the OLED devices facing away from the substrate, forming an isolation layer on the side of the water absorption layer facing away from the OLED devices, wherein the isolation layer is configured to block water vapor from entering the water absorption layer and the OLED devices; a material of the water absorption layer is able to absorb water vapor and change from an insulator to a conductor after absorbing the water vapor.

In one or more embodiments of this disclosure, a surface of the water absorption layer facing away from the OLED devices changes from the insulator to the conductor after absorbing the water vapor such that the water absorption layer functions as a touch layer for touch operations of the display panel, and the isolation layer is further configured to conduct an electrical signal on the surface of the water absorption layer facing away from the OLED devices during touch.

In one or more embodiments of this disclosure, the surface of the water absorption layer facing away from the OLED devices forms a hydrogel layer after absorbing water vapor, and the hydrogel layer includes ions generated by ionization.

In one or more embodiments of this disclosure, the water absorption layer is formed of a hydrophilic material doped with a material that is completely ionizable.

In one or more embodiments of this disclosure, the water absorption layer is formed of polyacrylamide doped with a lithium chloride salt.

In one or more embodiments of this disclosure, the isolation layer is formed of a hydrophobic material doped with charged particles.

In one or more embodiments of this disclosure, the isolation layer is formed of polyethylene terephthalate doped with polyaniline.

In one or more embodiments of this disclosure, the method of manufacturing an OLED display panel further comprises the steps of: forming a touch electrode connected to the water absorption layer, for inputting an electrical signal to the water absorption layer; forming a detection module connected to the touch electrode, for detecting the electrical signal of the touch electrode; and forming a control module connected to the detection module, for determining a touch position according to a change in the electrical signal of the touch electrode.

In one or more embodiments of this disclosure, forming the touch electrode includes forming a plurality of electrodes evenly distributed around a periphery of the water absorption layer; the detection module is configured to respectively detect electrical signals of the plurality of electrodes; and the control module is configured to determine a touch position according to a change in the electrical signals of the plurality of electrodes.

In one or more embodiments of this disclosure, the water absorption layer is formed to be rectangular, and forming a plurality of electrodes including forming a third electrode, a fourth electrode, a fifth electrode, and a sixth electrode, such that the third electrode, the fourth electrode, the fifth electrode, and the sixth electrode are respectively connected to four corners of the water absorption layer.

DETAILED DESCRIPTION

In order to allow those skilled in the art to understand the technical solution of this disclosure, the OLED display panel and the OLED display device provided by this disclosure will be described in detail below in conjunction with the accompanying drawings.

Figure 1:
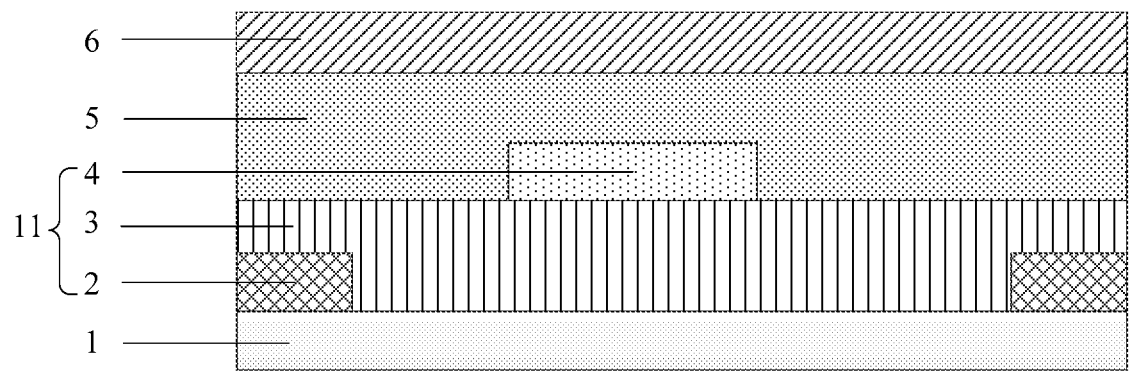
FIG. 1 is a schematic view of the structure of the OLED display panel provided according to one or more embodiments of this disclosure.

Embodiments of this disclosure provide an OLED display panel. As shown in FIG. 1, the OLED display panel includes a substrate 1, OLED devices 11, a water absorption layer 5, and an isolation layer 6. In one or more embodiments of this disclosure, the OLED device 11 includes a first electrode 2, an organic light-emitting function layer 3, and a second electrode 4 which are sequentially formed on the substrate 1. The water absorption layer 5 is located on the side of the second electrode 4 facing away from the organic light-emitting function layer 3, and the isolation layer 6 is located on the side of the water absorption layer 5 facing away from the second electrode 4. The material of the water absorption layer 5 can absorb water vapor, and changes from an insulator to a conductor after absorbing water vapor. The isolation layer 6 can block water vapor from entering the water absorption layer 5 and the OLED device 11. Specifically, after the second electrode 4 is formed on the organic light-emitting function layer 3, the water absorption layer 5 is formed on the surfaces of the second electrode 4 and the organic light-emitting function layer 3. Then, the isolation layer 6 is formed on the side of the water absorption layer 5 facing away from the second electrode 4. By providing the water absorption layer 5 and the isolation layer 6, the water vapor can be absorbed and isolated from the second electrode 4 and the organic light-emitting function layer 3, so as to be avoided from oxidizing the second electrode 4 and affecting the light-emitting performance of the organic light-emitting function layer 3, thereby improving the service life of the OLED display panel.

In one or more embodiments of the present disclosure, the surface of the water absorption layer 5 facing away from the second electrode 4 changes from an insulator to a conductor after absorbing water vapor, such that the water absorption layer 5 functions as the touch layer for the touch operation of the display panel. The isolation layer 6 is further configured to conduct the electrical signal on the surface of the water absorption layer 5 facing away from the second electrode 4 during touch. In one or more embodiments of the present disclosure, the water absorption layer 5 can absorb water vapor before forming the isolation layer 6 and in the process of forming the isolation layer 6 so as to function as the touch layer. In these embodiments, the isolation layer 6 is formed on the surface of the water absorption layer 5 facing away from the second electrode 4 after the surface absorbs water vapor and changes from an insulator to a conductor. In other embodiments of the present disclosure, the water absorption layer 5 can absorbs water vapor and function as touch layer after forming the isolation layer 6.

Therefore, in the above embodiments, the OLED display panel includes the water absorption layer 5 which functions as touch layer after absorbing water vapor and the isolation layer 6. Moreover, the surface of the water absorption layer 5 facing away from the second electrode 4 changes from an insulator to a conductor after absorbing water vapor and thus can conduct an electrical signal after absorbing water vapor, and the isolation layer 6 can conduct the electrical signal as well. Therefore, when a finger touches the isolation layer 6 on the upper surface of the OLED display panel, the electrical signal on the surface of the water absorption layer 5 facing away from the second electrode 4 can be conducted from the finger through the isolation layer 6, so that there is a change in the electrical signal on the surface of the water absorption layer 5 facing away from the second electrode 4. The touch position can be determined according to a change in the electrical signal, so that a touch structure is not required to be additionally attached on the outer side of the OLED display panel, thereby reducing the cost of the OLED display panel.

It should be noted that, this embodiment is described by exemplifying the first electrode 2 as an anode and the second electrode 4 as a cathode. Of course, it is also feasible that the first electrode 2 is a cathode and the second electrode 4 is an anode.

The material of the water absorption layer 5 can be a hydrophilic material. In one or more embodiments of this disclosure, the material of the water absorption layer 5 has a mesh structure, an interior of which can connect more water molecules to further improve the drying effect of the water absorption layer 5. Moreover, after absorbing water molecules, the mesh structure can form a hydrogel layer with a favorable transparency so that it is possible to improve the light-emitting brightness of the OLED display panel.

The material of the isolation layer 6 can be a hydrophobic material doped with charged particles. In one or more embodiments of the present disclosure, the hydrophobic material can be selected as polyethylene terephthalate, and the charged particles can be selected as polyaniline. Polyethylene terephthalate has a high light transmittance, and polyaniline has a high electrical conductivity. By this, the isolation layer 6 can not only isolate the water vapor, but also ensure the brightness of the OLED display panel, and can also rapidly transmit the electrical signal on the surface of the water absorption layer 5 facing away from the second electrode 4.

Figure 2:
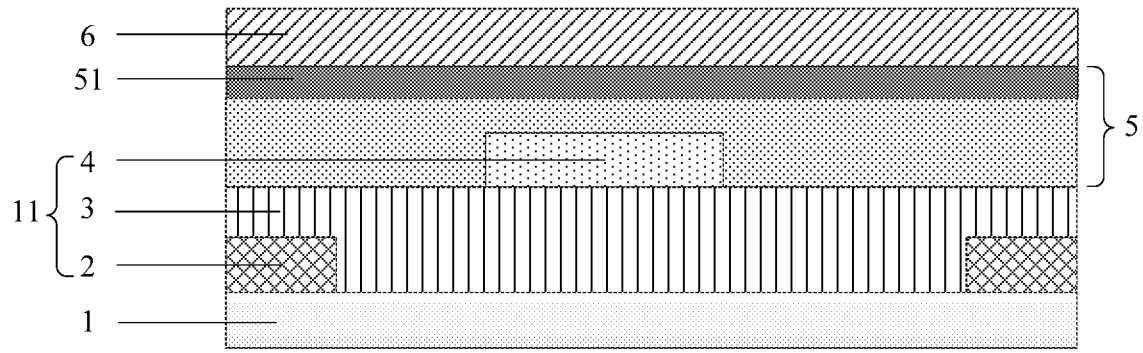
FIG. 2 is a schematic view of the structure of the OLED display panel provided according to one or more embodiments of this disclosure.

As shown in FIG. 2, the surface of the water absorption layer 5 facing away from the second electrode 4 after absorbing water vapor can form a hydrogel layer 51, within which ions can be generated by ionization so that the ions can conduct current. It should be noted that, as there is less amount of water vapor absorbed, the surface of the water absorption layer 5 adjacent to the second electrode 4 cannot form hydrogel layer 51, so that ions cannot be generated by ionization, i.e. this surface is an insulator which cannot conduct current, thereby avoiding short-circuit with the second electrode 4 below.

However, in the process of using the OLED display device according to this disclosure, in some cases, the water absorption layer 5 can possibly absorb a large amount of water vapor, thereby resulting in that the OLED device 11 below the water absorption layer 5 cannot work normally. However, even in such state, the water absorption layer 5 can still work normally and provide a touch function. Therefore, even in such state, the OLED display device according to this disclosure can still retain the touch function, and can be used as a touch pad, a writing pad, or a drawing pad.

In one or more embodiments of this disclosure, the material of the water absorption layer 5 is a high molecular polymer of polyacrylamide. The high molecular polymer of polyacrylamide away from the second electrode 4 can form a hydrogel after absorbing a certain amount of water vapor. The hydrogel has a transmittance of 98%, which can improve the light-emitting brightness of the OLED display panel. However, since there is less amount of water vapor absorbed, the high molecular polymer of polyacrylamide adjacent to the second electrode 4 cannot form a hydrogel, so that the light transmittance is low. In order to improve the transmittance of the high molecular polymer of polyacrylamide that does not absorb sufficient water vapor, in one or more embodiments of this disclosure, a nucleating agent can be added in the crystallizing process of the high molecular polymer of polyacrylamide. The nucleating agent crystallizes prior to polyacrylamide, and forms a fibrous network. The post-crystallized polyacrylamide can crystallize and nucleate on the surface of the fiber network, so that the high molecular polymer of polyacrylamide forms a homogenized spherulite. The spherulite structure has less scattering and refraction of light, and thus has higher light transmittance, so that it is possible to ensure normal display of the OLED display panel and improve the brightness of the OLED display panel.

In order to further improve the conductivity of the hydrogel layer 51, in one or more embodiments of this disclosure, the material of the water absorption layer 5 is doped with a material that can be completely ionized. Specifically, the material of the water absorption layer 5 is doped with a strong electrolyte material. When the surface of the water absorption layer 5 facing away from the second electrode 4 forms the hydrogel layer 51 after absorbing water vapor, the strong electrolyte material is favorably compatible with the hydrogel layer 51, and the strong electrolyte material can be completely ionized within the hydrogel layer 51, to generate more cations and anions so as to improve the conductivity of the hydrogel layer 51.

It should be noted that, the strong electrolyte material can be a strong acid, a strong alkali or a salt. In one or more embodiments of this disclosure, the material of the water absorption layer 5 is polyacrylamide doped with a lithium chloride salt. The lithium chloride salt which has a high water solubility, can generate more cations and anions by ionization, thereby improving the conductivity of the hydrogel layer 51.

In one or more embodiments of this disclosure, the OLED display panel is a flexible OLED display panel, and correspondingly, the substrate 1 is a flexible substrate. When the OLED display panel is stretched or bent, since the water absorption layer 5 has elasticity after absorbing water, it is possible to withstand great deformation, so that wrinkles or deformations may not occur, and further the display effect of the OLED display panel can be ensured.

Figure 3:
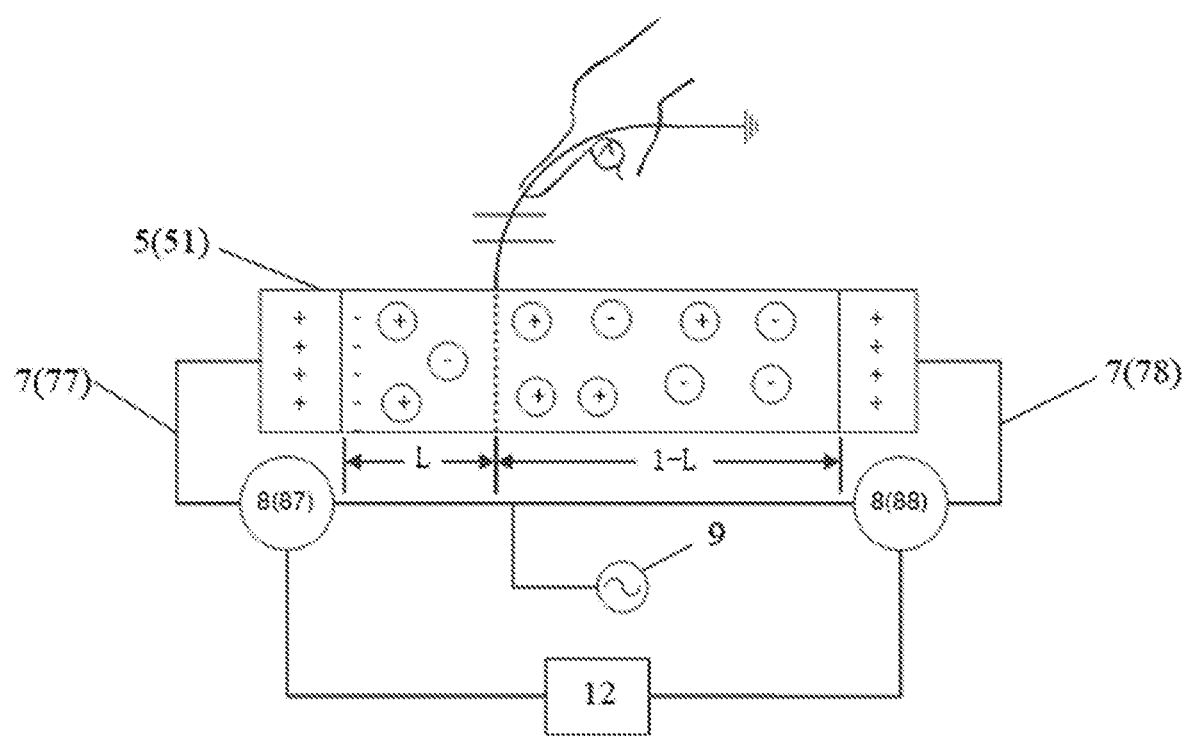
FIG. 3 is a schematic view of the structure of the OLED display panel provided according to one or more embodiments of this disclosure.

In combination with FIG. 2 and FIG. 3, the OLED display panel further comprises a control module 12, a detection module 8, and a touch electrode 7. The touch electrode 7 is connected to the water absorption layer 5, for inputting an electrical signal to the water absorption layer 5 after the water absorption layer 5 absorbs water vapor and becomes touch layer. The detection module 8 is connected to the touch electrode 7, for detecting the electrical signal of the touch electrode 7. The control module 12 is connected to the detection module 8, for determining a touch position according to a change in the electrical signal of the touch electrode 7. Specifically, the touch electrode 7 are connected to the hydrogel layer 51 of the water absorption layer 5 away from the surface of the second electrode 4, and the first power source 9 is configured to provide an electrical signal to the touch electrode 7.

The hydrogel layer 51 is capable of conducting an electrical signal input by the touch electrode 7 to form an electric field within the hydrogel layer 51. When the finger touches the isolation layer 6 on the surface of the OLED display panel, the electrical signal on the hydrogel layer 51 can be conducted from the finger through the isolation layer 6, to cause a change in the electrical signal of the touch electrode 7, so that the control module 12 can determine a touch position according to the change in the electrical signal detected by the detection module 8. Thus, it is not necessary to additionally attach the touch structure on the outer side of the OLED display panel, thereby reducing the cost of the OLED display panel.

It should be noted that, the electrical signal provided by the first power source 9 to the touch electrode 7 is an AC signal, and the ions within the hydrogel layer 51 conduct oriented movement under the effect of the AC signal, so that an alternating current is generated within the hydrogel layer 51. The alternating current can generate an alternating magnetic field, which can form an electric field. In this embodiment, description is made by exemplifying the detection module 8 which detects a current signal of the touch electrode 7. Of course, it is also feasible for the detection module 8 to detect a voltage signal of the touch electrode 7.

As shown in FIG. 3, the touch electrode 7 can include a plurality of electrodes, which are evenly distributed around a periphery of the water absorption layer 5. The detection module 8 is specifically configured to respectively detect the electrical signals of the electrodes, and the control module 12 is specifically configured to determine a touch position according to a change in the electrical signals of the respective electrodes.

Specifically, the touch electrodes 7 in this embodiment include a seventh electrode 77 and an eighth electrode 78 which are disposed at both ends in the length direction of the hydrogel layer 51. The seventh electrode 77 and the eighth electrode 78 are connected in parallel, that is, one end of the seventh electrode 77 and one end of the eighth electrode 78 are both connected to the first power source 9, while the other end of the seventh electrode 77 is connected to the left side of the hydrogel layer 51, and the other end of the eighth electrode 78 is connected to the right side of the hydrogel layer 51. The detection module 8 can include a seventh detection module 87 and an eighth detection module 88. The seventh detection module 87 can be connected to the seventh electrode 77, for detecting a current signal of the seventh electrode 77, and the eighth detection module 88 can be connected to the eighth electrode 78, for detecting a current signal of the eighth electrode 78. When the finger touches the OLED display panel, the currents of the seventh electrode 77 and the eighth electrode 78 both flow to the touch position, and correspondingly, the seventh detection module 87 and the eighth detection module 88 can detect that there are changes in the current signals of both the seventh electrode 77 and the eighth electrode 78.

It should be noted that, the first power source 9 provides a reference current to the seventh electrode 77 and the eighth electrode 78, so as to form an electric field within the hydrogel layer 51. In one or more embodiments of this disclosure, the reference currents on the seventh electrode 77 and the eighth electrode 78 are the same, so as to make a uniform electric field within the hydrogel layer 51.

Figure 4:
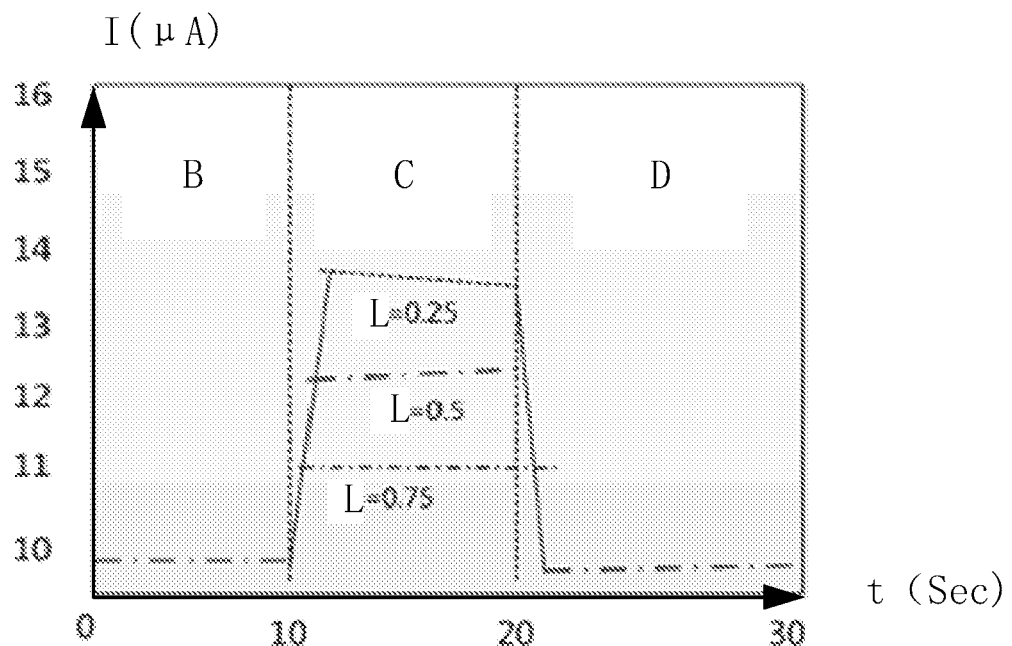
FIG. 4 is a timing diagram of the current of the seventh electrode provided according to one or more embodiments of this disclosure.

As shown in FIG. 4, the coordinates of the OLED display panel along the length direction are represented in a normalized manner, that is, the left end of the display panel is 0, and the right end thereof is 1. When the touch position L is 0.25, 0.5 or 0.75, the timing of the current signal $I_7$ of the seventh electrode 77 is as shown in FIG. 4. B is a current signal of the seventh electrode 77 before touch, C is a current signal of the seventh electrode 77 during the touch process, and D is a current signal of the seventh electrode 77 after touch. In the touch process, the current value $I_7$ of the seventh electrode 77 can vary, and after touch, the current value $I_7$ of the seventh electrode 77 returns to the reference current. In the touch process, the closer the distance of the touch position from the seventh electrode (i.e., the origin) is, the greater the current value $I_7$ of the seventh electrode 77 will be.

Figure 5:
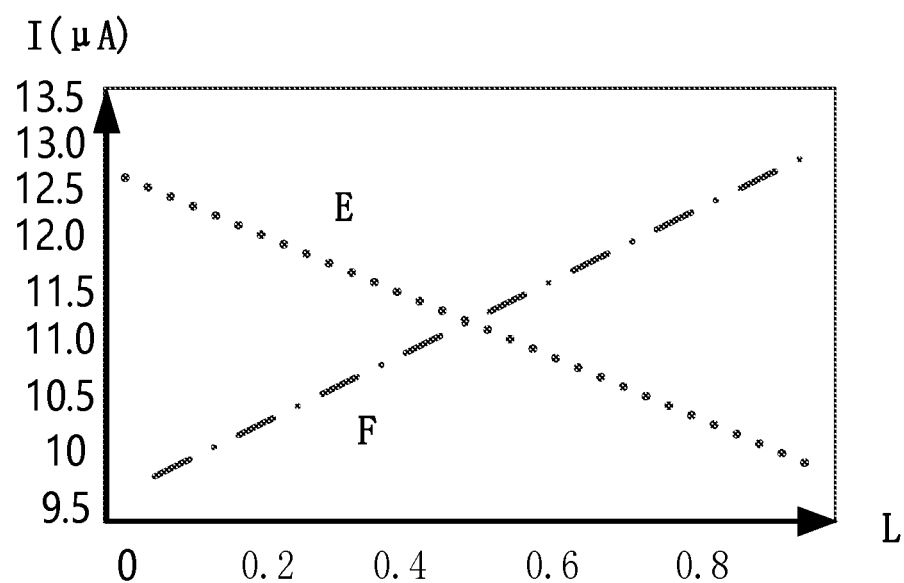
FIG. 5 is a diagram showing a relation between current and touch positions of the seventh electrode and the eighth electrode provided according to one or more embodiments of this disclosure.

When the finger moves from the left end of the OLED display panel to the right end of the OLED display panel, the relationship between the current signal and the touch position of the seventh electrode 77 and the eighth electrode 78 is as shown in FIG. 5. The relationship between the current value $I_7$ and the touch position L of the seventh electrode 77 is as shown by the curve E, and the current value $I_7$ of the seventh electrode 77 decreases as the touch position L increases in a linear manner. The relationship between the current value $I_8$ and the touch position L of the eighth electrode 78 is as shown by the curve F, and the current value $I_8$ of the seventh electrode 78 increases as the distance of the touch position L decreases in a linear manner.

Thus, in the touch process, the relationship between the amplitude of the current and the touch position on the electrode can be expressed by the following formula (1):

$$I_7*L=I_8*(1-L) \qquad (1),$$

wherein $I_7$ is the current value detected by the seventh detection module 87, $I_8$ is the current value detected by the eighth detection module 88, and L is the coordinate value of the touch position along the length direction.

After receiving the current value $I_7$ detected by the seventh detection module 87 and the current value $I_8$ detected by the eighth detection module 88, the control module 12 can obtain the coordinates of the touch position along the length direction on the OLED display panel by the formula (1).

Figure 6:
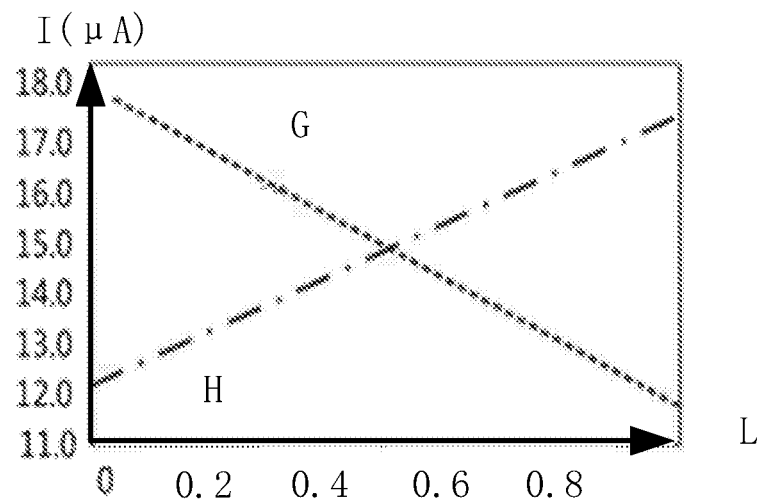
FIG. 6 is a diagram showing a relation between current and touch positions of the seventh electrode and the eighth electrode provided according to one or more embodiments of this disclosure.

It should be noted that, when the water absorption layer 5 functioning as the touch layer is stretched twice, the relationship between the current signal and the touch position of the seventh electrode 77 and the eighth electrode 78 is as shown in FIG. 6. The curve G of the current value $I_7$ and the touch position L of the seventh electrode 77 and the curve H of the current value $I_8$ and the touch position L of the eighth electrode 78 still remain in a linear relationship, so that it is still possible to ensure the accuracy in determining the touch position when the OLED display panel is stretched or bent.

Figure 7:
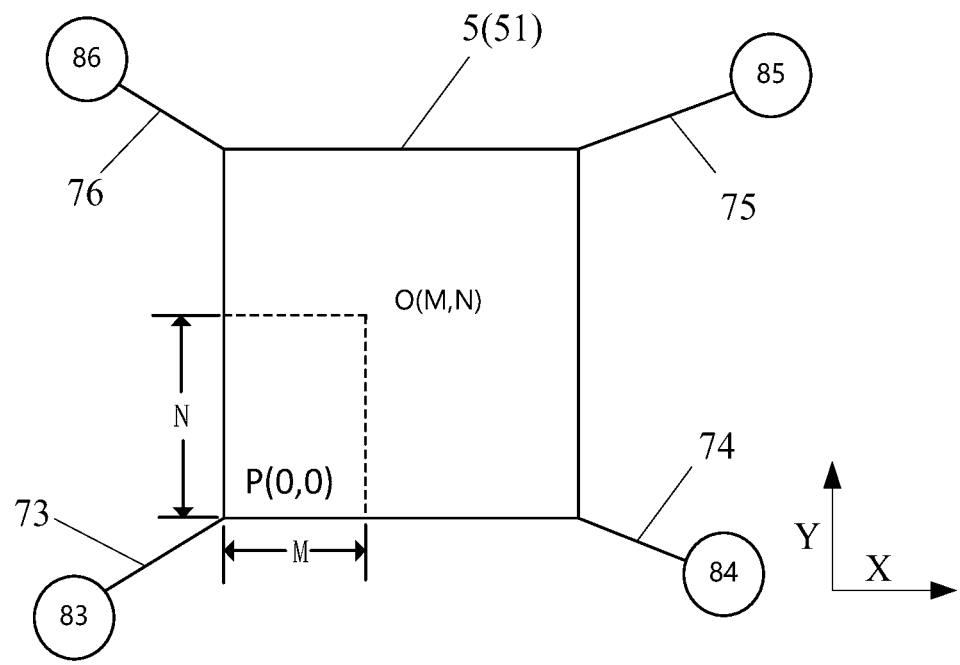
FIG. 7 is a schematic view of the structure of the OLED display panel provided according to one or more embodiments of this disclosure.
Figure 8:
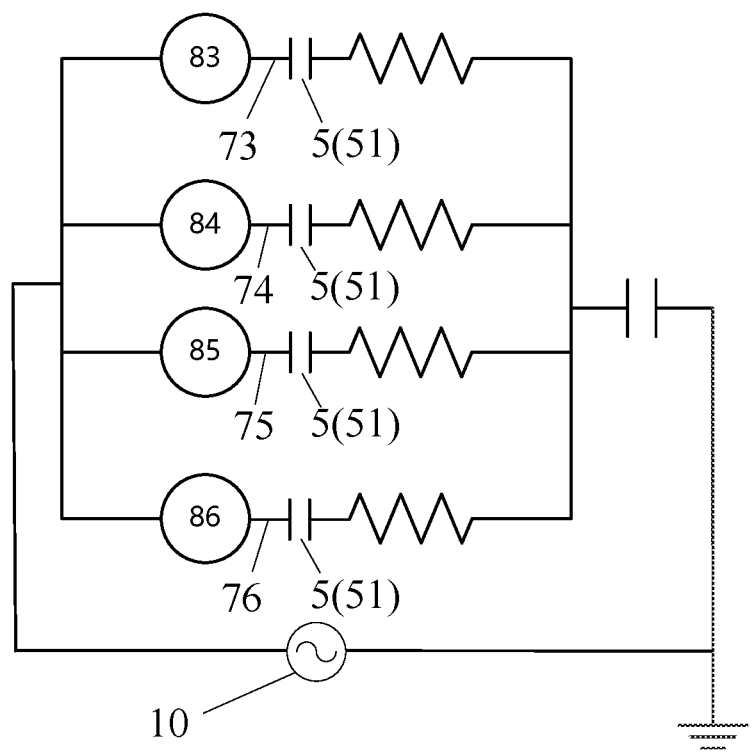
FIG. 8 is a schematic view of the circuit of the OLED display panel provided according to one or more embodiments of this disclosure.

In combination with the illustrations of FIG. 7 and FIG. 8, the water absorption layer 5 can be rectangular in a plan view, and the electrodes can include a third electrode 73, a fourth electrode 74, a fifth electrode 75, and a sixth electrode 76. In one or more embodiments of this disclosure, the third electrode 73, the fourth electrode 74, the fifth electrode 75, and the sixth electrode 76 are respectively connected to the four corners of the rectangle of the hydrogel layer 51. The plan view refers to a view obtained when viewed from the front of the OLED display panel.

The detection module 8 can include a first detection module 83, a second detection module 84, a third detection module 85, and a fourth detection module 86. The first detection module 83 is connected to the third electrode 73, for detecting a current signal of the third electrode 73. The second detection module 84 is connected to the fourth electrode 74, for detecting a current signal of the fourth electrode 74. The third detection module 85 is connected to the fifth electrode 75, for detecting a current signal of the fifth electrode 75. The fourth detection module 86 is connected to the sixth electrode 76, for detecting a current signal of the sixth electrode 76. The third electrode 73, the fourth electrode 74, the fifth electrode 75, and the sixth electrode 76 are connected in parallel, and are all connected to the second power source 10. The second drive circuit 10 is configured to provide a reference current to the third electrode 73, the fourth electrode 74, the fifth electrode 75, and the sixth electrode 76, so as to form a uniform electric field within the hydrogel layer 51.

As shown in FIG. 7, the coordinates on the OLED display panel are represented by normalization. If the left lower corner P of the display panel is the origin, the relationship between the amplitude of the current and the touch position on the electrode, in the X direction of the OLED display panel can be expressed by the following formula (2):

$$I_3 M = I_6 * (1-M) \qquad (2),$$

wherein $I_3$ is the current value detected by the first detection module 83, $I_4$ is the current value detected by the second detection module 84, and M is the coordinate value of the touch position in the X direction.

In the Y direction of the OLED display panel, the relationship between the amplitude of the current and the touch position on the electrode can be expressed by the following formula (3):

$$I_3 * N = I_6 * (1--N) \qquad (3),$$

wherein $I_3$ is the current value detected by the first detection module 83, $I_6$ is the current value detected by the fourth detection module 86, and N is the coordinate value of the touch position in the Y direction.

After receiving the current value $I_3$ detected by the first detection module 83 and the current value $I_4$ detected by the second detection module 84, the control module 12 can obtain the coordinate of the touch position in the X direction by the formula (2). After receiving the current value $I_3$ detected by the first detection module 83 and the current value $I_6$ detected by the fourth detection module 86, the control module 12 can obtain the coordinate of the touch position in the Y direction by the formula (3), so as to determine an accurate position of the touch position on the OLED display panel.

It should be noted that, as described above, the coordinates of the touch position on the OLED display panel are determined by taking the lower left corner of the OLED display panel as the origin. Of course, the coordinates of the touch position on the OLED display panel can also be determined by taking the other corners of the OLED display panel as the origin. In one or more embodiments of this disclosure, the coordinates of the touch positions on the OLED display panel corresponding to the respective corners as the origins can be respectively calculated by taking the corners of the OLED display panel as the origins, so that the coordinates of the four touch positions can be calibrated to each other to obtain a more accurate position of the touch position on the OLED display panel.

It should be noted that, in one or more embodiments of this disclosure, the control module 12 can include a current converting unit, a current amplifying unit, a signal converting unit, and a processing unit. After receiving the current signal sent by the detection module, the current converting unit first converts the received AC signal into a DC signal, and then the current amplifying unit amplifies the converted DC signal. The signal converting unit further converts the amplified current signal into a digital signal and sends the same to the processing unit. The processing unit determines a touch position according to the received digital signal.

Embodiments of this disclosure provide an OLED display device, which comprises the OLED display panel described above. The OLED display device can be any product or member having an OLED display function and a touch function, such as an electronic paper, a mobile phone, a tablet computer, a television, a digital photo frame, and the like.

The disclosure further provides a method of manufacturing an OLED display panel, comprising the steps of: forming OLED devices on the substrate, forming a water absorption layer on the side of the OLED devices facing away from the substrate, forming an isolation layer on the side of the water absorption layer facing away from the OLED devices, wherein the isolation layer is configured to block water vapor from entering the water absorption layer and the OLED devices, wherein a material of the water absorption layer is able to absorb water vapor and changes from an insulator to a conductor.

In one or more embodiments of the present disclosure, a surface of the water absorption layer facing away from the OLED devices changes from the insulator to the conductor after absorbing the water vapor such that the water absorption layer functions as a touch layer for touch operations of the display panel, and the isolation layer is further configured to conduct an electrical signal on the surface of the water absorption layer facing away from the OLED devices during touch. In one or more embodiments of the present disclosure, the water absorption layer can absorb water vapor before forming the isolation layer and in the process of forming the isolation layer so as to function as the touch layer. In these embodiments, the isolation layer is formed on the surface of the water absorption layer facing away from the second electrode after the surface absorbs water vapor and changes from an insulator to a conductor. In other embodiments of the present disclosure, the water absorption layer 5 can absorbs water vapor and function as touch layer after forming the isolation layer 6.

The features and technical effects described above with respect to the embodiments of OLED panel are also applied to the embodiments of the method of manufacturing an OLED display panel, and thus are omitted here.

It is to be understood that, the above embodiments are merely exemplary embodiments employed to explain the principles of this disclosure, but this disclosure is not limited thereto. Various modifications and improvements may be made by those skilled in the art without departing from the spirit and essence of this disclosure, and such modifications and improvements are also considered to be within the protection scope of this disclosure.

What is claimed is:

1. An OLED display panel, comprising a substrate, OLED devices formed on the substrate, a water absorption layer, and an isolation layer, a control module, a detection module, and a touch electrode, wherein the water absorption layer is located on a side of the OLED devices facing away from the substrate, and a material of the water absorption layer is able to absorb water vapor and change from an insulator to a conductor after absorbing the water vapor; and the isolation layer is located on a side of the water absorption layer facing away from the OLED devices, for blocking water vapor from entering the water absorption layer and the OLED devices;

the touch electrode is connected to the water absorption layer, for inputting an electrical signal to the water absorption layer;

the detection module is connected to the touch electrode, for detecting the electrical signal of the touch electrode; and the control module is connected to the detection module, for determining a touch position according to a change in the electrical signal of the touch electrode.

2. The OLED display panel according to claim 1, wherein a material of the water absorption layer is a hydrophilic material, and the material of the water absorption layer is doped with a material that is completely ionizable.

3. The OLED display panel according to claim 2, wherein the material of the water absorption layer is polyacrylamide doped with a lithium chloride salt.

4. The OLED display panel according to claim 1, wherein a material of the isolation layer is a hydrophobic material doped with charged particles.

5. The OLED display panel according to claim 4, wherein the material of the isolation layer is polyethylene terephthalate doped with polyaniline.

6. The OLED display panel according to claim 1, wherein the touch electrode includes a plurality of electrodes, which are evenly distributed around a periphery of the water absorption layer;
the detection module is configured to respectively detect electrical signals of the plurality of electrodes; and
the control module is configured to determine a touch position according to a change in the electrical signals of the plurality of electrodes.

7. The OLED display panel according to claim 6, wherein the water absorption layer is rectangular;
the plurality of electrodes include a third electrode, a fourth electrode, a fifth electrode, and a sixth electrode, which are respectively connected to four corners of the water absorption layer.

8. The OLED display panel according to claim 1, wherein a surface of the water absorption layer facing away from the OLED devices changes from the insulator to the conductor after absorbing the water vapor such that the water absorption layer functions as a touch layer for touch operations of the OLED display panel, and the isolation layer is further configured to conduct an electrical signal on the surface of the water absorption layer facing away from the OLED devices during touch.

9. The OLED display panel according to claim 8, wherein the surface of the water absorption layer facing away from the OLED devices forms a hydrogel layer after absorbing water vapor, and the hydrogel layer includes ions generated by ionization.

10. An OLED display device, comprising an OLED display panel, the OLED display panel comprises a substrate, OLED devices formed on the substrate, a water absorption layer, an isolation layer, a control module, a detection module, and a touch electrode, wherein
the water absorption layer is located on a side of the OLED devices facing away from the substrate, and a material of the water absorption layer is able to absorb water vapor and change from an insulator to a conductor after absorbing the water vapor;
the isolation layer is located on a side of the water absorption layer facing away from the OLED devices, for blocking water vapor from entering the water absorption layer and the OLED devices;
the touch electrode is connected to the water absorption layer, for inputting an electrical signal to the water absorption layer;
the detection module is connected to the touch electrode, for detecting the electrical signal of the touch electrode; and
the control module is connected to the detection module, for determining a touch position according to a change in the electrical signal of the touch electrode.

11. A method of manufacturing an OLED display panel, comprising steps of:
forming OLED devices on a substrate,
forming a water absorption layer on a side of the OLED devices facing away from the substrate,
forming an isolation layer on a side of the water absorption layer facing away from the OLED devices, wherein the isolation layer is configured to block water vapor from entering the water absorption layer and the OLED devices,
forming a touch electrode connected to the water absorption layer, for inputting an electrical signal to the water absorption layer;
forming a detection module connected to the touch electrode, for detecting the electrical signal of the touch electrode; and
forming a control module connected to the detection module, for determining a touch position according to a change in the electrical signal of the touch electrode,
wherein a material of the water absorption layer is able to absorb water vapor and change from an insulator to a conductor after absorbing the water vapor.

12. The manufacturing method according to claim 11, wherein the water absorption layer is formed of a hydrophilic material doped with a material that is completely ionizable.

13. The manufacturing method according to claim 12, wherein the water absorption layer is formed of polyacrylamide doped with a lithium chloride salt.

14. The manufacturing method according to claim 11, wherein forming the touch electrode includes forming a plurality of electrodes evenly distributed around a periphery of the water absorption layer;
the detection module is configured to respectively detect electrical signals of the plurality of electrodes; and
the control module is configured to determine a touch position according to a change in the electrical signals of the plurality of electrodes.

15. The manufacturing method according to claim 14, wherein the water absorption layer is formed to be rectangular;
forming a plurality of electrodes including forming a third electrode, a fourth electrode, a fifth electrode, and a sixth electrode, such that the third electrode, the fourth electrode, the fifth electrode, and the sixth electrode are respectively connected to four corners of the water absorption layer.

16. The manufacturing method according to claim 11, wherein a surface of the water absorption layer facing away from the OLED devices changes from the insulator to the conductor after absorbing the water vapor such that the water absorption layer functions as a touch layer for touch operations of the OLED display panel, and the isolation layer is further configured to conduct an electrical signal on the surface of the water absorption layer facing away from the OLED devices during touch.

17. The manufacturing method according to claim 16, wherein the surface of the water absorption layer facing away from the OLED devices forms a hydrogel layer after absorbing water vapor, and the hydrogel layer includes ions generated by ionization.

* * * * *